United States Patent
Eng et al.

(10) Patent No.: US 9,625,524 B2
(45) Date of Patent: *Apr. 18, 2017

(54) EFFICIENT METHOD OF RETESTING INTEGRATED CIRCUITS

(71) Applicant: International Business Machines Corporation, Armonk, NY (US)

(72) Inventors: Teck Seng Eng, Singapore (SG); Michael Russell Uy Gonzales, Quezon Province (PH); Louie Que Hermosura, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/837,402

(22) Filed: Aug. 27, 2015

(65) Prior Publication Data

US 2015/0369862 A1 Dec. 24, 2015

Related U.S. Application Data

(63) Continuation of application No. 13/833,308, filed on Mar. 15, 2013, now Pat. No. 9,494,650.

(51) Int. Cl.
*G01R 31/317* (2006.01)
*G01R 31/28* (2006.01)
*G01R 31/3177* (2006.01)

(52) U.S. Cl.
CPC ..... *G01R 31/3177* (2013.01); *G01R 31/2832* (2013.01); *G01R 31/2894* (2013.01); *G01R 31/31718* (2013.01)

(58) Field of Classification Search
CPC .......... G01R 31/3177; G01R 31/31718; G01R 31/2894

(Continued)

(56) References Cited

U.S. PATENT DOCUMENTS 5,764,650 A * 6/1998 Debenham ............. G01R 31/01
714/704
5,935,264 A * 8/1999 Nevill .................. G01R 31/287
714/724

(Continued)

OTHER PUBLICATIONS

List of IBM Patents or Applications Treated as Related, Aug. 2015.

*Primary Examiner* — Gregory J Toatley
*Assistant Examiner* — Terence Stifter, Jr.
(74) *Attorney, Agent, or Firm* — Lieberman & Brandsdorfer, LLC (57) ABSTRACT

Efficient production testing of integrated circuits. A first production test is implemented on a group of integrated circuits and failures among the test group are assessed. Specifically, the results of the first test are analyzed such that integrated circuits having a recoverable fail and integrated circuits having a non-recoverable fail are differentiated. The integrated circuits are integrated based on the analyzed results and a second production test is implemented. The second production test tests the integrated circuits responsive to the segregation, such that the second production test is limited only to integrated circuits with a recoverable fail. The next succeeding production test will then use the new test program in the second production test with the handler bin designated as having integrated circuits not to be retested.

7 Claims, 5 Drawing Sheets

(58) Field of Classification Search
USPC .......................................................... 702/117
See application file for complete search history.

(56) References Cited

U.S. PATENT DOCUMENTS

| | | |
|---|---|---|
| 7,463,047 B2 | 12/2008 | Balchiunas |
| 8,185,337 B1 | 5/2012 | Zverez et al. |
| 2005/0267706 A1* | 12/2005 | Balchiunas ........ G01R 31/2831 702/117 |
| 2011/0000829 A1* | 1/2011 | Linde ...................... B07C 5/344 209/571 |

* cited by examiner

EFFICIENT METHOD OF RETESTING INTEGRATED CIRCUITS

CROSS REFERENCE TO RELATED APPLICATION(S)

This application is a continuation patent application claiming the benefit of the filing date of U.S. patent application Ser. No. 13/833,308 filed on Mar. 15, 2013 and titled "Efficient Method of Retesting Integrated Circuits" now pending, which is hereby incorporated by reference.

BACKGROUND

Technical Field

The present invention relates to testing integrated circuits for final test area. More specifically, the invention relates to a process for efficient testing of integrated circuits through successive testing with embedded segregation.

Background

An integrated circuit, hereinafter referred to as an IC, is a small electronic device made out of a semi-conductor wafer. IC testing is integral to the process of manufacturing ICs to ensure that the ICs meet quality control standards. Manufacturing of ICs is in itself a time sensitive process. Similarly, testing of integrated circuits is also time consuming.

Different testing protocols have been employed to reduce a cycle time for testing ICs. While some of these protocols reduce testing time, there are aspects of IC testing that are negatively affected, including, but not limited to, deterioration in test intensiveness. Time is a factor in IC testing, but it is not the sole factor. Prior art solutions that reduce time for IC testing have been affected with test coverage issues and a decrease in product reliability. Implementing hardware or software upgrades may also reduce testing cycle time. However, such upgrades involve a cost as it requires replacement of existing hardware or software resources or fabricating additional hardware or software. In addition, any hardware or software upgrade may also require longer implementation time. Accordingly, prior art solutions pertaining to test time reduction and hardware or software upgrades have compromised testing cost and/or product reliability.

SUMMARY OF THE INVENTION

This invention comprises a method for efficiently testing integrated circuits.

A first test is implemented on at least one IC. The results of the first test are analyzed, with the analysis including a differentiation between a pass and a fail, and with respect to the fail, further differentiation between an IC with a recoverable fail and an IC with a non-recoverable fail. Once differentiated, the tested integrated circuit may be segregated from other integrated circuits. Specifically, the segregation of the integrated circuit is characterized by the analyzed results and any associated fail. A second production test for testing one or more integrated circuits is implemented responsive to the segregation. The second test is limited to those integrated circuits identified from the first test with a recoverable fail.

Other features and advantages of this invention will become apparent from the following detailed description of the presently preferred embodiment of the invention, taken in conjunction with the accompanying drawings.

BRIEF DESCRIPTION OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

The functional unit described in this specification has been labeled with tools, modules, and/or managers. The functional unit may be implemented in programmable hardware devices such as field programmable gate arrays, programmable array logic, programmable logic devices, or the like. The functional unit may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of an identified functional unit need not be physically located together, but may comprise disparate instructions stored in different locations which, when joined logically together, comprise the functional unit and achieve the stated purpose of the functional unit.

Indeed, a functional unit of executable code could be a single instruction, or many instructions, and may even be distributed over several different code segments, among different applications, and across several memory devices. Similarly, operational data may be identified and illustrated herein within the functional unit, and may be embodied in any suitable form and organized within any suitable type of data structure. The operational data may be collected as a single data set, or may be distributed over different locations including over different storage devices, and may exist, at least partially, as electronic signals on a system or network.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of managers, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the invention may be practiced. It is to be understood that other embodiments may be utilized because structural changes may be made without departing from the scope of the present invention.

Figure 1:
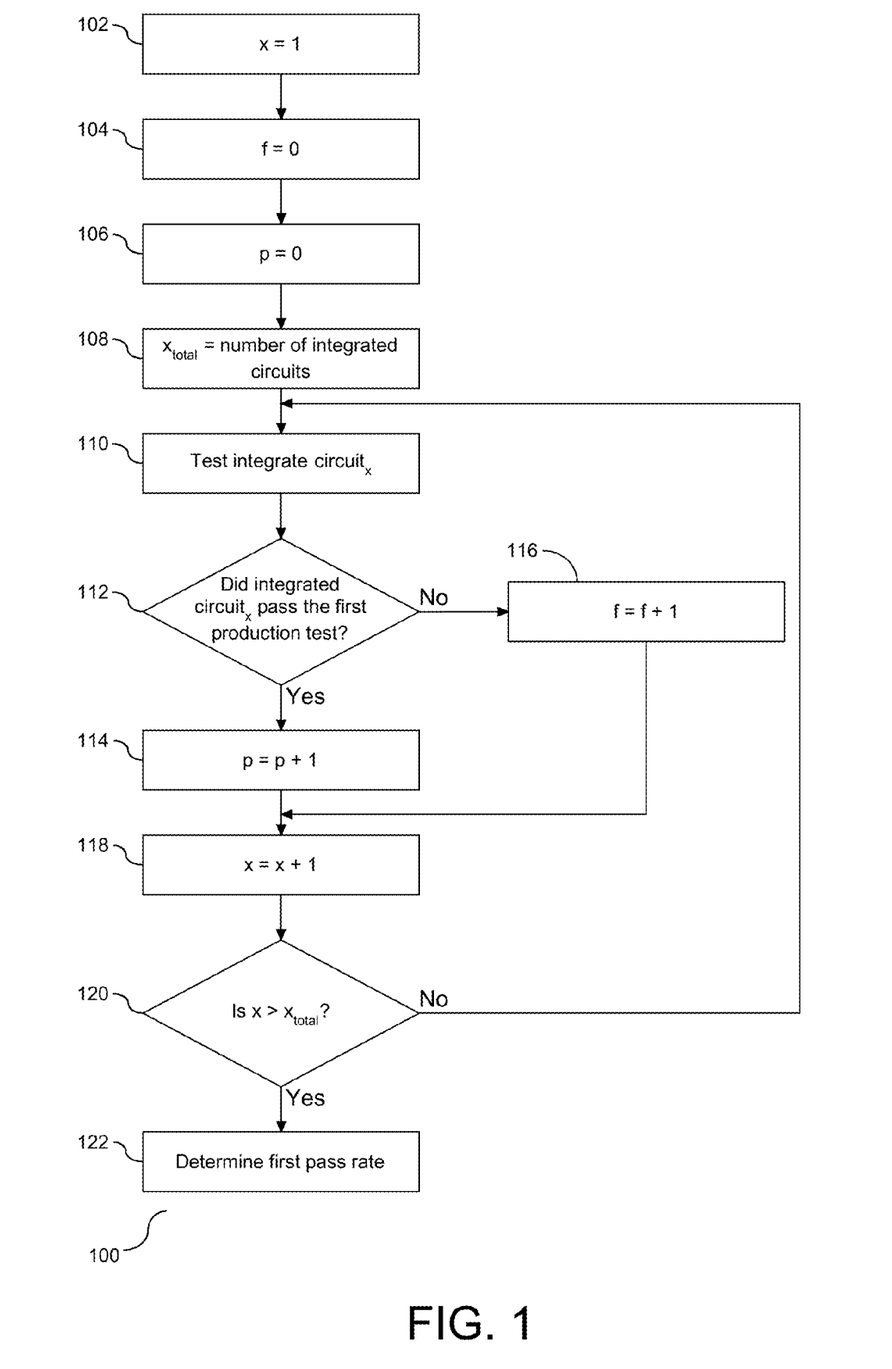
FIG. 1 depicts a flow chart illustrating a method for conducting a first production test.

In order to maximize production testing efficiency on integrated circuits, multiple tests may be employed, and the results of a first production test are used to attain an efficiency of additional testing. FIG. 1 is a flow chart (100) illustrating a method for utilizing a first production test of one or more integrated circuits to achieve efficiency in production testing of integrated circuits. Three counting variables are initialized, (102), (104), and (106) respectively, with the counting variable x representing the number of ICs tested, the counting variable f representing the number of ICs that fail the first production test, and the counting variable p representing the number of ICs that pass the first production test. A variable $X_{total}$ (108) identifies the number of integrated circuits for testing in the first production test. $IC_x$ is tested (110), and it is determined whether $IC_x$ passed the first production test (112). A positive response to the determination at step (112) is followed by an increment of the pass counting variable p, (114). However, a negative response to the determination at step (112) is followed by an increment of a fail counter as represented by the fail counting variable f (116). In one embodiment $IC_x$, assessed to have failed the first production test, is placed in a corresponding bin handler dedicated to failed integrated circuits. Accordingly, the ICs are tested and the number of IC passes and fails are recorded.

Following the increment of the pass or fail counting variable at either step (114) or (116), respectively, the IC counting variable, x, is incremented (118). It is then determined whether all of the integrated circuits have been tested (120). A negative response to the determination at step (120) is followed by a return to step (110), and a positive response is followed by an assessment of a pass rate for the first production test (122). Once the first production test for all of the ICs is completed, the pass rate for the first production test is assessed. As shown at step (114), a pass counter is incremented for each integrated circuit that has passed the first production test. Similarly, at step (116), a fail counter is incremented for each integrated circuit that has failed the first production test. The pass rate is assessed following completion of the first production test for a set of integrated circuits. In one embodiment, the pass rate is based on a ratio of the passed integrated circuits and the number of integrated circuits assessed in total. Accordingly, a first production test is employed and a pass rate is determined.

Figure 2A:
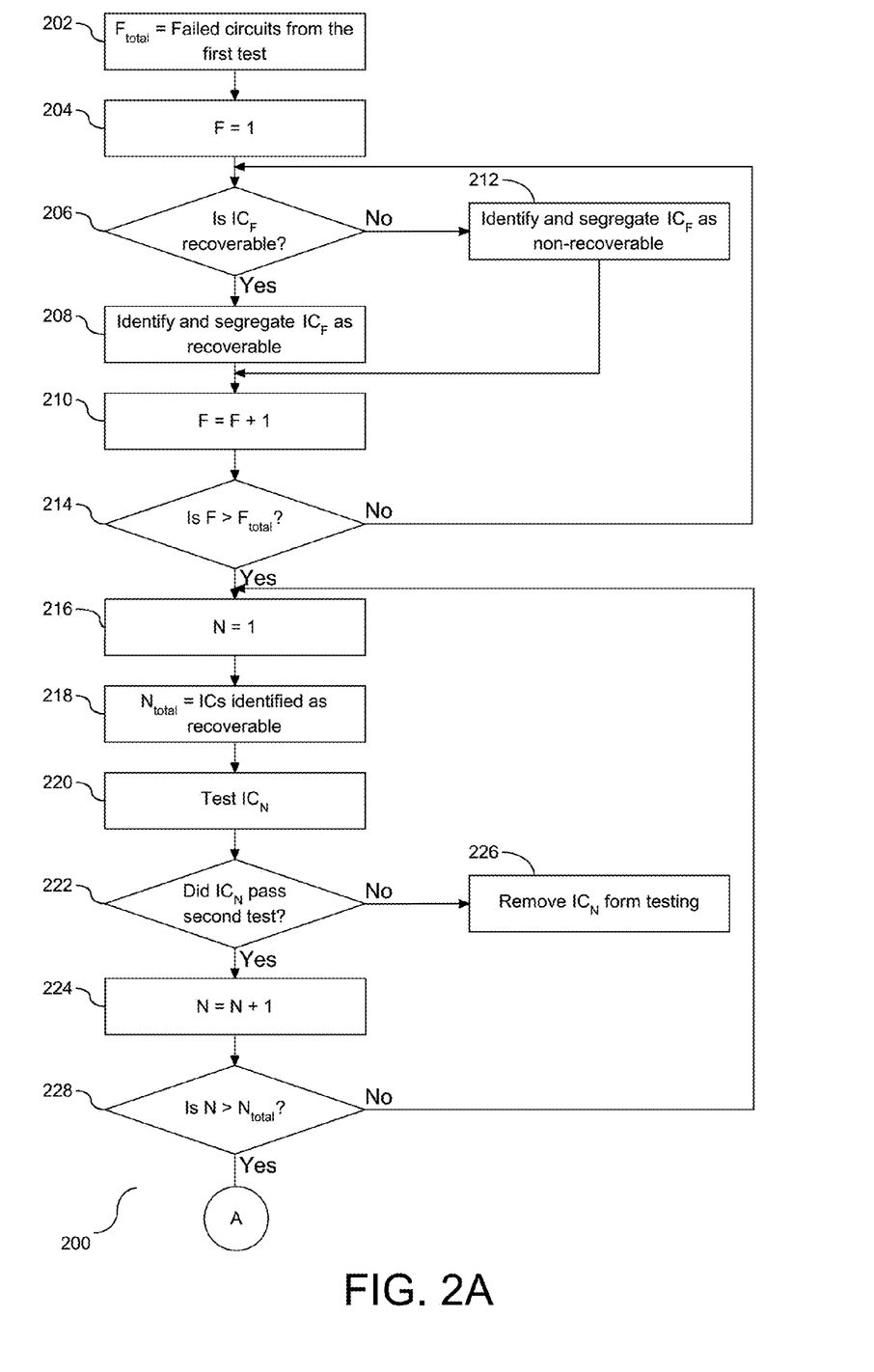
FIGS. 2A and 2B depict a flow chart illustrating a method for conducting a second production test.
Figure 2B:
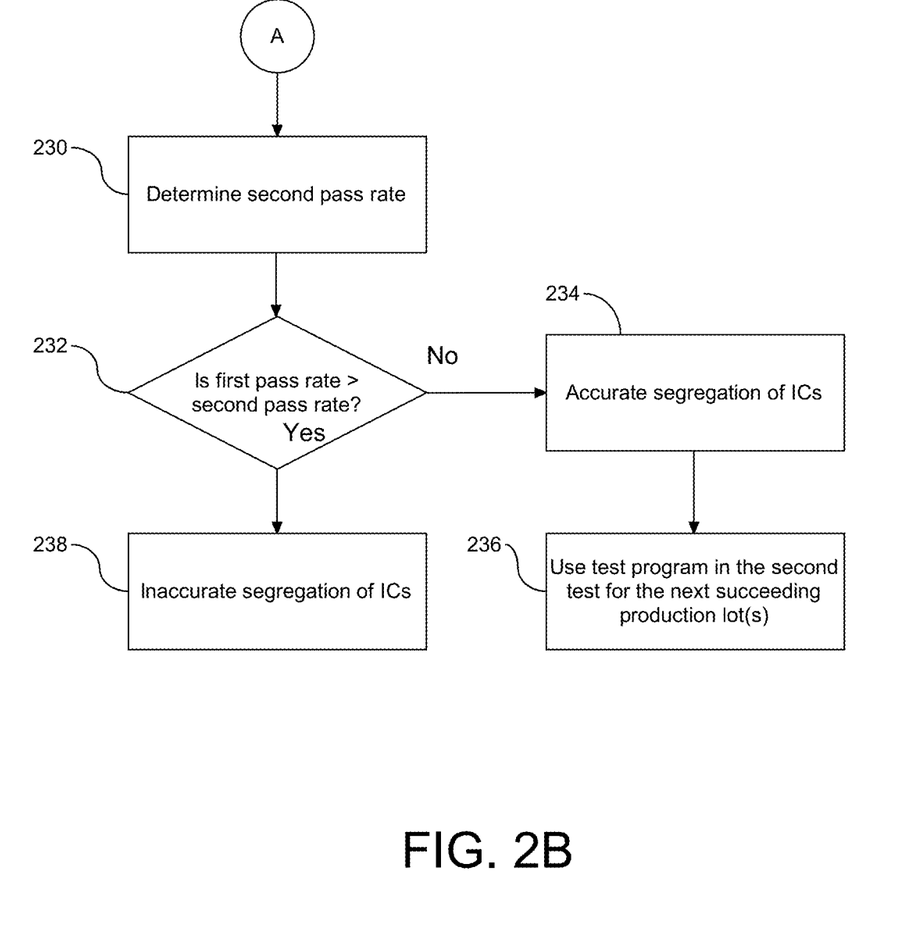

Once each integrated circuit has been processed by the first production test, a second production test is employed for a selection of the ICs that failed the first production test, and for the succeeding lots to be tested. FIGS. 2A and 2B depict a flow chart (200) illustrating a method for preparing and implementing this second production test. Based on the results from the first production test, integrated circuits are segregated into those that passed and those that failed. For the integrated circuits that failed the first production test, there is a further segregation to identify integrated circuits with non-recoverable fails from integrated circuits with recoverable fails. In one embodiment, the integrated circuits are segregated by moving the non-recoverable failed integrated circuits to a handler bin designated as having integrated circuits not to be re-tested. Placement of ICs into bins is employed to control sorting of the product with respect to future production testing. Accordingly, integrated circuits with recoverable fails are differentiated from integrated circuits with non-recoverable fails.

The second production test is limited to ICs identified as having a recoverable fail and in one embodiment, runs in parallel to the first test as described in FIG. 1. The variable $F_{total}$ identifies a quantity of the failed ICs of the first production test (202), and an associated counting variable F is initialized (204). For each failed $IC_x$, it is determined if the $IC_x$ has a recoverable fail (206). A positive response to the determination at step (206) is followed by identifying and segregating $IC_F$ as a recoverable fail (208). The variable f is subsequently incremented (210). Similarly, a negative response to step (206) is followed by identifying and segregating $IC_F$ as a non-recoverable fail (212), followed by a return to step (210). After the increment of the failed IC counting variable, it is determined whether all of the failed ICs were tested for a recoverable fail (214). In one embodiment, the assessment at step (214) is conducted for the ICs assessed with a non-recoverable fail. A negative response to the determination at step (214) is followed by a return to step (206). Accordingly, for each failed integrated circuit of the first production test it is determined if the IC has been identified with a recoverable fail or a non-recoverable fail.

Upon completion of the segregation of all failed circuits from the first test into recoverable fails and non-recoverable fails, each IC with a recoverable fail is subject to the second production test. A positive response to step (214) is followed by initialized a counting variable for the ICs identified to have a recoverable fail, N (216), where $N_{total}$ is the total number of ICs identified with a recoverable fail (218). Thereafter, $IC_N$ is subject to the second production test (220), and it is then determined if $IC_N$ passed the second production test (222). In one embodiment, the assessment at step (222) is for the ICs that failed the second production test. A positive response to step (222) is followed by incrementing counting variable N (224). In one embodiment, responsive to passing the second production test, $IC_N$ is placed in a handle bin designated for integrated circuits that passed the second production test. A negative response to the determination at step (222) is followed by removing $IC_N$ from the group of integrated circuits previously identified with a recoverable fail (226), followed by a return to step (224). In one embodiment, responsive to failing the second production test, $IC_N$ is placed in a handle bin designated for integrated circuits that failed the second production test. Accordingly, ICs subject to the second production test are also subject to a second segregation.

Following the pass-fail analysis of $IC_N$ subject to the second production test, the IC counting variable N is incremented (226), followed by determining if all the integrated circuits previously identified as having a recoverable fail or a non-recoverable fail were tested (228). A negative response to step (228) is followed by a return to step (216). However, a positive response to step (228) is followed by determining a second pass rate (230), with the second pass rate pertaining to the pass rate of the ICs subject to the second production test. Accordingly, the second production test and the succeeding production lot testing is limited to testing ICs that were determined to have a recoverable fail from the first production test.

As demonstrated, integrated circuits with a non-recoverable fail were not subject to the second production test. Therefore, the determined second pass rate of the second production test should theoretically be greater than the first pass rate of the first production test. In the second production test a select quantity of IC fails from the first production test are excluded, e.g. the second production test is limited to recoverable fails. As such, the denominator in the rate assessment is likely less than that in the first production test, thereby alluding to a theoretically greater pass rate for the second production test. A comparison of the first and second pass rates provides insight into the accuracy of the segregation. Following step (230), it is determined if the first pass rate is greater than the second pass rate. A positive response to step (232) is an indication that the integrated circuits were inaccurately segregated for the second production test (238). However, a negative response to step (232) is an indication that the ICs were accurately segregated for the second production test (234). Following the assessment at step (234), the test program employed for the second production test is selected for use in the testing of ICs in the next succeeding production lot (236). Accordingly, the accuracy of the IC segregation is assessed through comparison of the first and second pass rates.

As will be appreciated by one skilled in the art, aspects of the present invention may be embodied as a system, method or computer program product. Accordingly, aspects of the present invention may take the form of an entirely hardware based embodiment, an entirely software based embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium, such as a storage device. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 3:
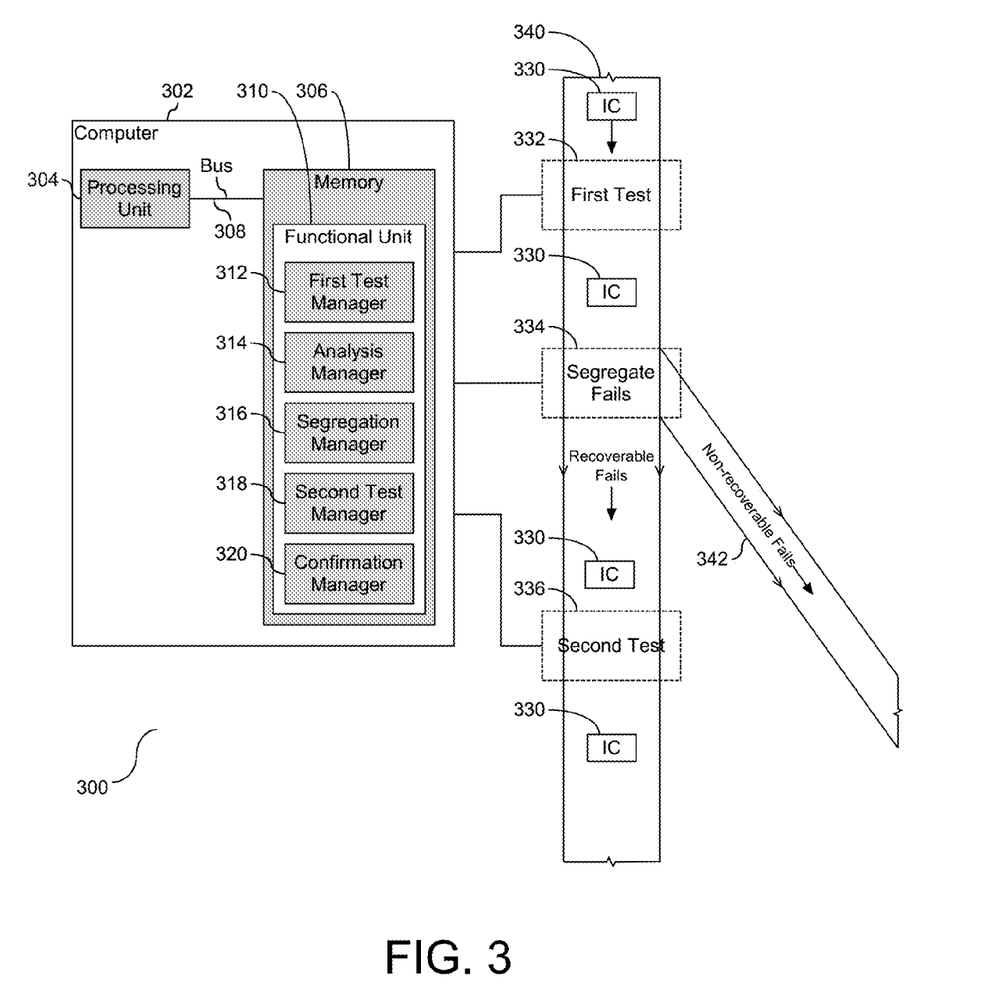
FIG. 3 depicts a block diagram of a system for integrated circuit testing.

A system is also provided for implementing the IC production testing method as described above. FIG. 3 is a block diagram (300) illustrating a system for IC testing. A computer is provided (302) having a processing unit (304) in communication with memory (306) across a bus (308). A functional unit (310) is provided in communication with memory (306), with the functional unit (310) having tools for implementation of IC testing. The tools provided include, but are not limited to: a first test manager (312), an analysis manager (314), a segregation manager (316), a second test manager (318), and in one embodiment, a confirmation manager (320). Accordingly, a computer is provided with a functional unit having tools for the automation of IC testing.

A first production test is performed on the ICs (330) as the ICs (330) advance through a testing location (340). The first production test (332), as implemented by the first test manager (312), assesses the ICs for any failures. In one embodiment, the first production test (332) specifically tests for any open/short failure or any hard failure within an IC. In one embodiment, the first test manager (312) determines a first pass rate from the first production test (332), the first pass rate responsive to the proportion of ICs passing the first test (332). The analysis manager (314), which is in communication with the first test manager (312), analyzes the results of the first test. Specifically, the analysis manager (314) differentiates between ICs subject to the first production test (332) that have a recoverable fail and ICs that have a non-recoverable fail. The segregation manager (316), in communication with the analysis manager (314), segregates the ICs (334). The ICs are segregated according to the differentiation established by the analysis manager (314). In one embodiment, the segregation manager (316) segregates the ICs (334) to a location (342) removed from the testing location (340). In one embodiment, the segregation manager (316) changes specification within a handler binning of the first production test. Accordingly, a first production test is performed on the ICs and the ICs are segregated according to ICs classified with recoverable fails and ICs with non-recoverable fails.

The second test (336), as implemented by the second test manager (318), is limited to ICs identified from the first production test (332) with recoverable fails. In one embodiment, the second test manager (318) determines a second pass rate, the second pass rate is based upon the proportion of ICs passing the second test (336). In one embodiment, the confirmation manager (320) is provided and measures the difference between the first and second identified pass rates. A decrease in cycle time from the first pass rate to the second pass rate demonstrates an accurate segregation of the ICs, while an increase in the second pass rate from the first rate demonstrates an inaccurate segregation of the ICs. The segregation manager (316) assesses an accurate segregation of the integrated circuits. In one embodiment, the segregation manager (316) replaces the first production test with the second production test as a new test program for a next succeeding production lot of one or more integrated circuit based on an accurate segregation. Accordingly, the second test manager (318) tests ICs with recoverable fails and the accuracy of the IC segregation is assessed.

As identified above, the first test manager (312), the analysis manager (314), the segregation manager (316), the second test manager (318), and the confirmation manager (320), hereinafter referred to as tools, function as elements to support testing of ICs. The tools (312), (314), (316), (318), and (320) are shown residing in memory (306) local to the computer (302). However, the tools (312), (314), (316), (318), and (320) may reside as hardware tools external to memory (306), or they may be implemented as a combination of hardware and software. Similarly, in one embodiment, the tools (312), (314), (316), (318), and (320) may be combined into a single functional item that incorporates the functionality of the separate items. In one embodiment, the tools they may be collectively or individually distributed across a network or multiple machines and function as a unit. Accordingly, the tools may be implemented as software tools, hardware tools, or a combination of software and hardware tools.

Figure 4:
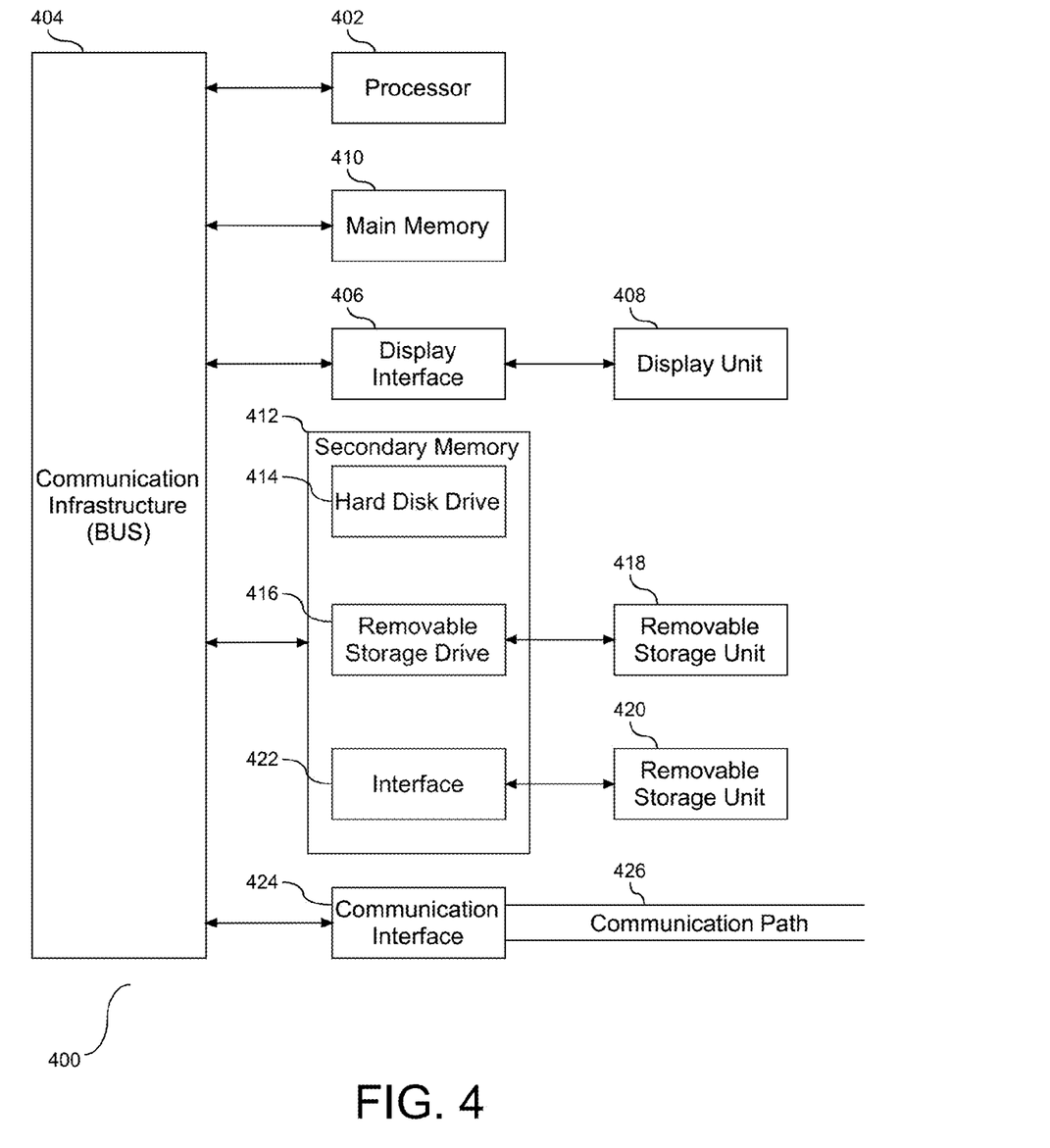
FIG. 4 depicts a block diagram showing a system for implementing an embodiment of the present invention.

Referring now to the block diagram of FIG. 4, additional details are now described with respect to implementing an embodiment of the present invention. The computer system includes one or more processors, such as a processor (402). The processor (402) is connected to a communication infrastructure (404) (e.g., a communications bus, cross-over bar, or network).

The computer system can include a display interface (406) that forwards graphics, text, and other data from the communication infrastructure (404) (or from a frame buffer not shown) for display on a display unit (408). The computer system also includes main memory (410), preferably random access memory (RAM), and may also include secondary memory (412). The secondary memory (412) may include, for example, a hard disk drive (414) and/or a removable storage drive (416), representing, for example, a floppy disk drive, a magnetic tape drive, or an optical disk drive. The removable storage drive (416) reads from and/or writes to a removable storage unit (418) in a manner well known to those having ordinary skill in the art. Removable storage unit (418) represents, for example, a floppy disk, a compact disc, a magnetic tape, or an optical disk, etc., which is read by and written to a removable storage drive (416). As will be appreciated, the removable storage unit (418) includes a computer readable medium having stored therein computer software and/or data.

In alternative embodiments, the secondary memory (412) may include other similar means for allowing computer programs or other instructions to be loaded into the computer system. Such means may include, for example, a removable storage unit (420) and an interface (422). Examples of such means may include a program package and package interface (such as that found in video game devices), a removable memory chip (such as an EPROM, or PROM) and associated socket, and other removable storage units (420) and interfaces (422) which allow software and data to be transferred from the removable storage unit (420) to the computer system.

The computer system may also include a communications interface (424). A communications interface (424) allows software and data to be transferred between the computer system and external devices. Examples of a communication interface (424) may include a modem, a network interface (such as an Ethernet card), a communications port, or a PCMCIA slot and card, etc. Software and data transferred via a communication interface (424) is in the form of signals which may be, for example, electronic, electromagnetic, optical, or another signal capable of being received by communications interface (424). These signals are provided to communications interface (424) via a communications path (i.e., channel) (426). This communications path (426) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (410) and secondary memory (412), removable storage drive (416), and a hard disk installed in a hard disk drive (414).

Computer programs (also called computer control logic) are stored in main memory (410) and/or secondary memory (412). Computer programs may also be received via a communication interface (424). Such computer programs, when run, enable the computer system to perform the features of the present invention as discussed herein. In particular, the computer programs, when run, enable the processor (402) to perform the features of the computer system. Accordingly, such computer programs represent controllers of the computer system.

The flowchart(s) and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
implementing a first production test for testing at least one integrated circuit;
analyzing results of the first test, including differentiating between an integrated circuit with a recoverable fail and an integrated circuit with a non-recoverable fail;
identifying a first pass rate of the at least one integrated circuit from the first test;
segregating the integrated circuits, the segregation characterized by the analyzed results and any associated fail;
implementing a second production test for testing the integrated circuits responsive to the segregation, the second test consisting of each integrated circuit with a recoverable fail;
identifying a second pass rate of the at least one integrated circuit from the second test;
comparing the first and second identified pass rates; and
determining an accuracy of segregation of the integrated circuits based on the comparison.

2. The method of claim 1, wherein the segregation includes changing specifications within a handler binning of the first test.

3. The method of claim 1, further comprising assessing an accurate segregation of the integrated circuits, and replacing the first production test with the second production test as a new test program for a next succeeding production lot of one or more integrated circuits based on the accurate segregation.

4. A method comprising:
implementing a first production test for testing at least one integrated circuit;
analyzing results of the first test, including differentiating between an integrated circuit with a recoverable fail and an integrated circuit with a non-recoverable fail;
segregating the integrated circuits, the segregation characterized by the analyzed results and any associated fail;
implementing a second production test for testing the integrated circuit responsive to the segregation, the second test consisting of each integrated circuit with a recoverable fail; and
assessing an accurate segregation of the integrated circuits, and replacing the first production test with the second production test as a new test program for a next succeeding production lot of one or more integrated circuits based on the accurate segregation.

5. The method of claim 4, further comprising identifying a first pass rate of the at least one integrated circuit from the first test and a second pass rate of the at least one integrated circuit from the second test.

6. The method of claim 5, further comprising comparing the first and second identified pass rates, and determining an accuracy of segregation of the integrated circuits based on the comparison.

7. The method of claim 4, wherein the segregation includes changing specifications within a handler binning of the first test.

* * * * *